(12) United States Patent
Bruin et al.

(10) Patent No.: US 7,471,137 B2
(45) Date of Patent: Dec. 30, 2008

(54) FREQUENCY-INDEPENDENT VOLTAGE DIVIDER

(75) Inventors: Paulus Petrus Franciscus Maria Bruin, Nijmegen (NL); Arnoldus Johannes Maria Emmerik, Nijmegen (NL)

(73) Assignee: NXP B.V., Eindhoven (NL)

( * ) Notice: Subject to any disclaimer, the term of this patent is extended or adjusted under 35 U.S.C. 154(b) by 260 days.

(21) Appl. No.: 10/531,603

(22) PCT Filed: Sep. 19, 2003

(86) PCT No.: PCT/IB03/04290

§ 371 (c)(1),
(2), (4) Date: Apr. 14, 2005

(87) PCT Pub. No.: WO2004/036745

PCT Pub. Date: Apr. 29, 2004

(65) Prior Publication Data

US 2005/0285660 A1    Dec. 29, 2005

(30) Foreign Application Priority Data

Oct. 18, 2002    (EP) .................................. 02079336

(51) Int. Cl.
*G11C 5/13*    (2006.01)

(52) U.S. Cl. ................. 327/530; 327/531; 327/562
(58) Field of Classification Search .............. None
See application file for complete search history.

(56) References Cited

U.S. PATENT DOCUMENTS

| 5,594,279 | A | * | 1/1997 | Itou et al. | 257/758 |
|---|---|---|---|---|---|
| 5,600,176 | A | * | 2/1997 | Bucksch | 257/536 |
| 5,744,385 | A | * | 4/1998 | Hojabri | 438/238 |
| 6,100,750 | A | * | 8/2000 | Van Der Zee | 327/531 |
| 6,414,367 | B1 | * | 7/2002 | Hopper | 257/503 |

OTHER PUBLICATIONS

Choi W-Y et. al.; A Voltage-Controlled Tunable Thin-Film Distributed RC Notch Filter; vol. 24, No. 1; Mar. 2001; pp. 33-37; USA.

* cited by examiner

*Primary Examiner*—Quan Tra
*Assistant Examiner*—Khareem E Almo

(57) ABSTRACT

The present invention relates to a frequency-independent voltage divider in which a compensation structure (10) for compensating a distributed parasitic capacitance of a resistor arrangement (20) is arranged between the resistor arrangement (20) and a substrate (50). Thereby, the compensation structure (10) shields the resistor arrangement (20) partly from the substrate (50), and thus shields the parasitic capacitance. This allows for an improved compensation.

6 Claims, 3 Drawing Sheets

FREQUENCY-INDEPENDENT VOLTAGE DIVIDER

The present invention relates to a voltage divider arrangement comprising a reference terminal, an input terminal for receiving an input signal with respect to the reference terminal, an output terminal for supplying an output signal with respect to the reference terminal, and a resistor arrangement arranged on a substrate and coupled between the input terminal and the reference terminal.

In such voltage divider arrangements, respective compensation capacitors are integrated to provide a frequency-independent voltage dividing function. Frequency-independent voltage dividers are known from the general state of the art. As an example, document U.S. Pat. No. 6,100,750 discloses a frequency-independent voltage divider arrangement of the type defined in the opening paragraph, wherein a distributed compensation capacitor having one side coupled to the input terminal and having another side coupled to the resistor arrangement is provided in a distributed fashion. In particular, the distributed compensation capacitor is constituted by a conductor track of the resistor arrangement, a further conductor track which covers the conductor track at least partly and is coupled to the input terminal, and an insulator which insulates the conductor track from the further conductor track.

FIG. 1 shows a schematic circuit diagram of the frequency-independent voltage divider. The resistor arrangement comprises a series arrangement of resistors with more than two resistors $R_1$ to $R_{M+1}$. An arbitrary node of the series arrangement can be loaded by a parasitic capacitor $CP_k$. A compensation capacitor $CCMP_k$ is coupled between the relevant arbitrary node and the input terminal arranged at the left side of the circuit diagram. Thus, the distributed parasitic capacitance CP of resistor R is compensated by a distributed compensation capacitance CCMP. In FIG. 1 it is assumed that the last node M+1 at the right-hand side of the circuit diagram is connected to ground.

To achieve a frequency independent resistive behaviour, the capacitive voltage division on each node should exactly match the resistive voltage division. This means that for all k (k=1, 2, ... M) the following equation must be met:

$$\frac{CP_k}{CCMP_k} = \frac{R_1 + R_2 + \ldots + R_k}{R_{k+1} + R_{k+2} + \ldots + R_{M+1}} \quad [1]$$

If the above criterion is met, all the signal transfers from the input terminal to the nodes are frequency-independent of the input signal. Therefore, it is possible to couple a plurality of output terminals to a plurality of nodes in order to take off a plurality of output signals which are all frequency-independent.

In a practical embodiment, the frequency-independent voltage divider based on the above principle can be realized by means of an integrated resistor. In this case, the integrated resistor may be regarded as an infinite number of infinitesimal series-connected resistors $R_1$ to $R_{M+1}$, where M approximates infinity.

FIG. 2 shows a plan view of a folded integrated resistor 20 with a meandering shape as described in the above prior art. In order to satisfy the above criterion, a distributed compensation capacitance 10 is generated by forming a conductive layer 10 on top of the resistor arrangement 20 and separated by an insulation layer 30. The integrated resistor 20 is connected between the input terminal 2 and the reference terminal 1, while the distributed compensation capacitance 10 is also connected to the input terminal 2.

FIG. 3 shows a side view of this known frequency-independent voltage divider where the integrated resistor 20 is isolated from a substrate or handle wafer 50 by a first insulator 40, and the compensation is made through the distributed compensation capacitance, e.g. a conductor track 10, isolated from the integrated resistor 20 by a second insulation layer 30. For low values of the index k, the ratio $CP_k/CCMP_k$ must approach zero.

This would mean that $CCMP_k$ should increase to infinity. However, this cannot be achieved due to the limited width of the body of the integrated resistor 20. Consequently, an inherent error is made in the compensation.

It is therefore an object of the present invention to provide a frequency-independent voltage divider arrangement by means of which an improved compensation of the parasitic capacitance can be obtained.

This object is achieved by a voltage divider arrangement as claimed in claim 1.

Accordingly, a new way of constructing a frequency-independent voltage divider is proposed. The influence of parasitic capacitances is compensated by a compensation capacitance structure arranged between the resistor arrangement and the substrate. This new way of construction offers a better compensation and opens new possibilities for the use of these voltage dividers in integrated circuit processes or situations where the known construction is not possible. Due to the fact that the compensation structure is located between the resistor and the substrate, the compensation structure shields the resistor partly from the substrate, and thus shields the parasitic capacitance. Whereas in the known distributed resistor, the parasitic capacitance of every segment of the resistor is equal, in the distributed resistor according to the invention the sum of the areas of the parasitic capacitance and the compensation capacitance is equal. This allows for better compensation, due to the fact that it is now possible to achieve a ratio between the parasitic capacitance and the compensation capacitance which approximates zero for low values of k.

The resistor arrangement may have a meandering shape and may be made of poly-silicon. The distributed compensation capacitance structure may comprise a conductor layer of predetermined shape, e.g. a triangular shape, and may be made of suitable conducting material, e.g. heavily doped silicon. Furthermore, the distributed compensation capacitance structure may be separated from the resistor arrangement and the substrate by respective insulation layers which may be made of suitable non-conducting material, e.g. of silicon oxide. This arrangement of the distributed compensation capacitance structure between the insulation layers provides as a further advantage depending on the applied IC processes that the insulation layers are able to withstand a larger voltage than in the known prior art structure.

Further advantageous developments are defined in the dependent claims.

In the following, the present invention will be described in greater detail based on a preferred embodiment with reference to the accompanying drawings in which.

The preferred embodiment will now be described on the basis of an integrated voltage divider with a resistor arrangement 20 of a meandering shape.

Figure 1:
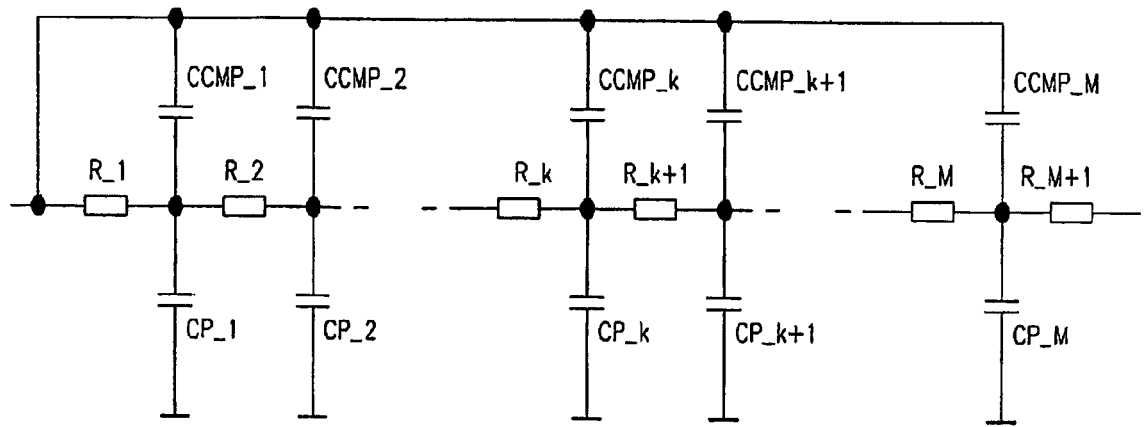
FIG. 1 shows a schematic equivalent circuit diagram of a frequency-independent voltage divider.
Figure 2:
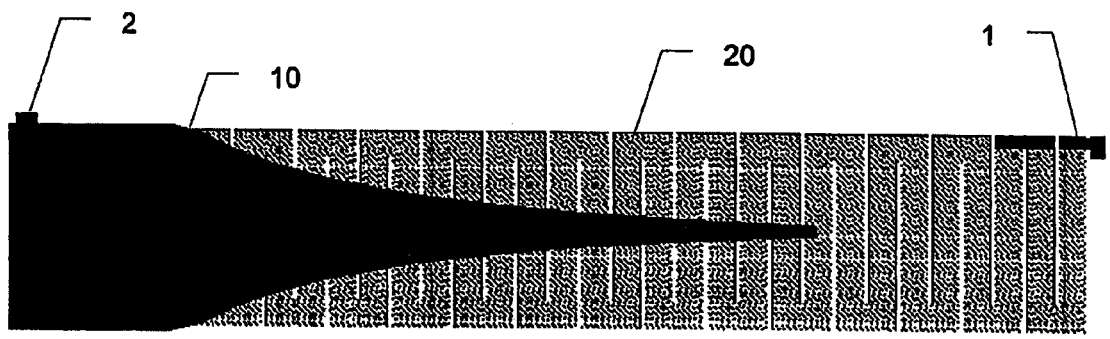
FIG. 2 shows a plan view of a layout of a known frequency-independent voltage divider.
Figure 3:
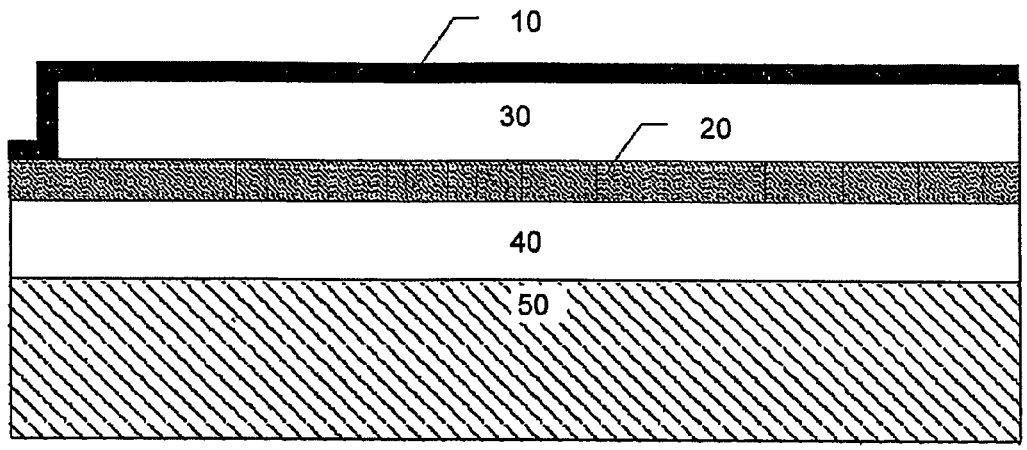
FIG. 3 shows a side view of the known frequency-independent voltage divider of FIG. 2.
Figure 4:
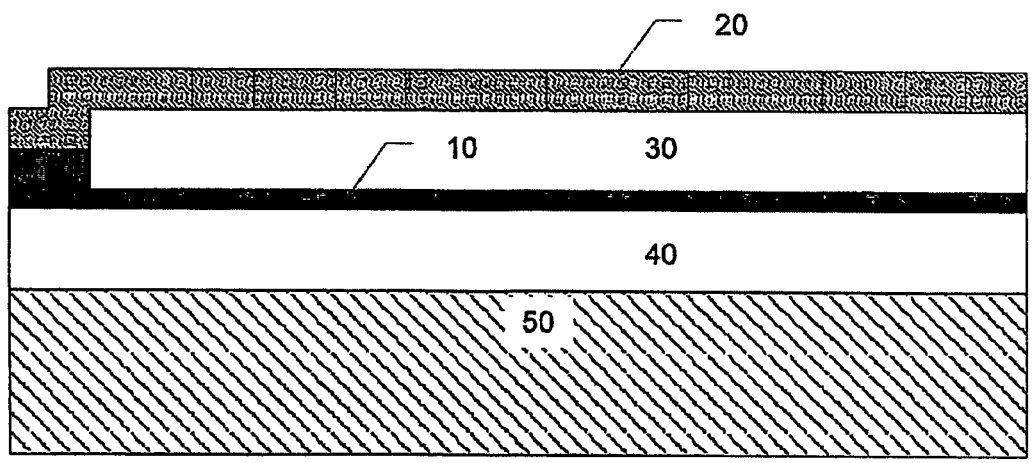
FIG. 4 shows a side view of a frequency-independent voltage divider according to the preferred embodiment of the present invention.

FIG. 4 shows a side view of the frequency-independent voltage divider according to the preferred embodiment. Contrary to the known arrangement of FIG. 3, the distributed compensation capacitance structure 10 now shields the resistor arrangement 20 partly from the substrate 50. Thereby, the distributed parasitic capacitance is also shielded. While in the known design of FIG. 3, the parasitic capacitance of every segment of the resistor arrangement 20 is equal, now the sum of the areas of the parasitic capacitance $CP_k$ and the compensation capacitance $CCMP_k$ is equal. This allows for a better compensation, because it is now possible to achieve a ratio of $CP_k/CCMP_k$ approximating to zero for low values of k, which was not possible in the known designs, as $CCMP_k$ would have to increase to infinity.

To achieve optimum compensation, the width $D_k$ of the compensation layer of the distributed compensation capacitance structure must be determined for every k=1, 2, ... M. To achieve this, it is assumed that the resistance of the resistor arrangement 20 is equal for every segment k, i.e. $R_1 = R_2 = \ldots = R_{M+1}$.

Furthermore $CP_k = CP_{sq} \cdot (DR - D_k) \cdot WR$, wherein $CP_{sq}$ is the parasitic capacitance per unit area of resistor, WR is the width of the resistor body of the resistor arrangement 20, DR is the length of one resistor segment or the width of the total resistor layout, and $D_k$ is the width of the compensation capacitance structure at segment k.

Consequently, the compensation capacitance can be calculated as follows:

$$CCMP_k = CCMP_{sq} \cdot D_k \cdot WR \quad [2]$$

Based on equation [1] the following equation can be obtained:

$$\frac{CP_{sq} \cdot (DR - D_k)}{CCMP_{sq} \cdot D_k} = \frac{k}{M + 1 - k} \quad [3]$$

From the above equation [3] the width of the compensation structure 10 can be calculated as follows:

$$D_k = \frac{DR}{1 + \frac{k}{M+1-k} \cdot \frac{CCMP_{sq}}{CP_{sq}}} \quad [4]$$

Figure 5:
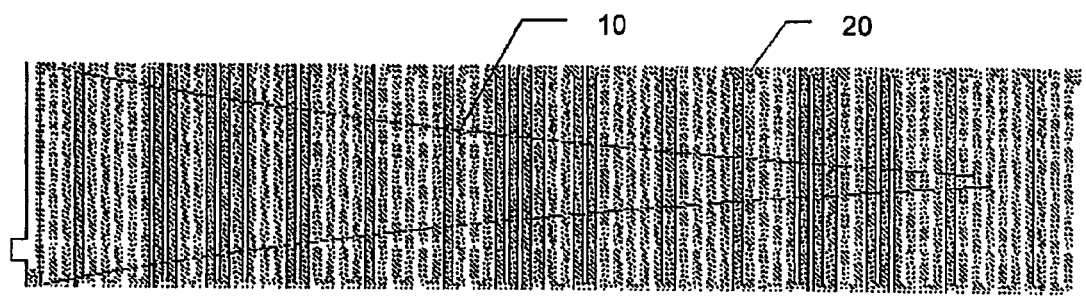
FIG. 5 shows a plan view of the frequency-independent voltage divider according to the preferred embodiment.

The resulting shape of the compensation capacitance structure 10 corresponds to a triangular shape as indicated in FIG. 5. This compensation structure 10 is arranged between the resistor arrangement 20 and the substrate 50 and is separated by respective upper and lower insulation layers 30, 40. The upper insulation layer 30 and the lower insulation layer 40 may both be made e.g. of silicon oxide or another suitable non-conducting material. The compensation capacitance structure 10 may be made of heavily doped silicon or another suitable conduction material, and the resistor arrangement 20 may be made of poly-silicon.

Figure 6:
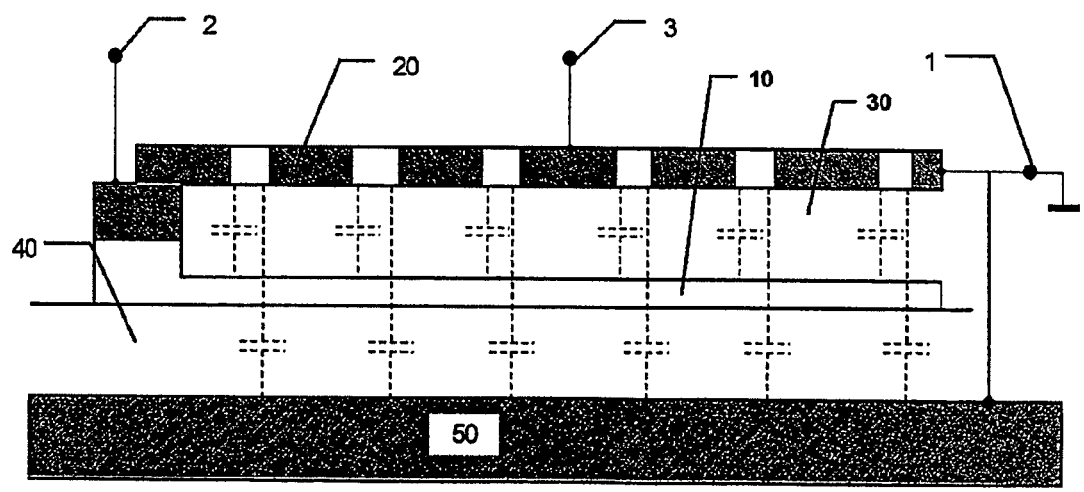
FIG. 6 shows a schematic cross-sectional side view of the frequency-independent voltage divider according to the preferred embodiment with connection terminals.

FIG. 6 shows an equivalent diagram of the proposed frequency-independent voltage divider with respective connection terminals 1, 2, 3. At the meandering resistor arrangement 20, an input terminal 2, an output terminal 3 and a reference terminal 1 are provided, wherein the reference terminal 1 is connected to the substrate 50 and to electrical ground level. Furthermore, equivalent parasitic capacitances are schematically shown, whereby the shielding function of the compensation capacitance structure is made clear.

The proposed improved frequency-independent voltage divider can be used specifically in high-frequency applications such as RGB amplifiers in television integrated circuits, radio frequency (RF) amplifiers, oscilloscope probes or the like.

It is noted that the present invention is not restricted to the above-preferred embodiment but can be used in any voltage divider arrangement where a distributed compensation capacitance structure is provided for compensating a distributed parasitic capacitance of a resistor arrangement. In particular, the resistor arrangement 20 and the compensation capacitance structure 10 may be provided with any shape suitable to obtain the required compensation, e.g. to satisfy the criterion set out in equation [1]. Moreover, any other suitable conductive material may be used for implementing the resistor arrangement 20 and the compensation capacitance structure. The preferred embodiment may thus vary within the scope of the attached claims.

The invention claimed is:

1. A voltage divider arrangement comprising a reference terminal (1), an input terminal (2) for receiving an input signal with respect to said reference terminal (1), an output terminal (3) for supplying an output signal with respect to said reference terminal (1), and a resistor arrangement (20) arranged on a substrate (50) and coupled between said input terminal (2) and said reference terminal (1), wherein a distributed compensation capacitance structure (10) for compensating the influence of a distributed parasitic capacitance is arranged between said resistor arrangement (20) and said substrate (50); wherein said distributed compensation capacitance structure (10) is separated from said resistor arrangement (20) and said substrate (50) by respective insulation layers (30, 40).

2. A voltage divider arrangement according to claim 1, wherein said resistor arrangement (20) has a meandering shape.

3. A voltage divider arrangement according to claim 2, wherein said resistor arrangement (20) is made of poly-silicon.

4. A voltage divider arrangement according to claim 1, wherein said distributed compensation capacitance structure (10) comprises a conductor layer of a predetermined shape.

5. A voltage divider arrangement according to claim 4, wherein said predetermined shape is a triangular shape.

6. A voltage divider arrangement according to claim 4, wherein the width of said conductor layer in the horizontal direction is selected according to the following equation:

$$D_k = \frac{DR}{1 + \frac{k}{M+1-k} \cdot \frac{CCMP_{sq}}{CP_{sq}}}$$

wherein $CP_{sq}$ denotes the parasitic capacitance per unit area of resistor, DR denotes the length of said resistor arrangement (20), k denotes an index of a segment of said transistor arrangement (20); M denotes the total number of segments of said transistor arrangement (20), $CCMP_{sq}$ denotes the distributed compensation capacitance per unit area of resistor and $D_k$ denotes said width of said conductor layer.

* * * * *